(12) United States Patent
Wang et al.

(10) Patent No.: US 12,550,454 B2
(45) Date of Patent: Feb. 10, 2026

(54) TRANSISTOR UNIT AND ARRAY AND INTEGRATED CIRCUIT THEREOF

(71) Applicant: CHANGXIN MEMORY TECHNOLOGIES, INC., Hefei (CN)

(72) Inventors: Yuzhe Wang, Hefei (CN); Xin Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 537 days.

(21) Appl. No.: 17/954,573

(22) Filed: Sep. 28, 2022

(65) Prior Publication Data

US 2023/0013672 A1 Jan. 19, 2023

Related U.S. Application Data

(63) Continuation of application No. PCT/CN2022/092382, filed on May 12, 2022.

(30) Foreign Application Priority Data

Dec. 24, 2021 (CN) .......................... 202111602790.7

(51) Int. Cl.
  *H10D 89/60* (2025.01)
(52) U.S. Cl.
  CPC .................................. *H10D 89/811* (2025.01)
(58) Field of Classification Search
  CPC ..... H10D 89/811; H10D 84/014–0142; H10D 30/611; H10D 30/615; H10D 30/023;

(Continued)

(56) References Cited

U.S. PATENT DOCUMENTS

| 9,466,596 B2 | 10/2016 | Sutardja |
| 9,859,271 B2 | 1/2018 | Lee |

(Continued)

FOREIGN PATENT DOCUMENTS

| CN | 1164932 A | 11/1997 |
| CN | 1571164 A | 1/2005 |

(Continued)

OTHER PUBLICATIONS

State Intellectual Property Office of the People's Republic of China, Office Action and Search Report Issued in Application No. 202111602790.7, Apr. 18, 2024, 6 pages.

*Primary Examiner* — Shahed Ahmed
(74) *Attorney, Agent, or Firm* — Kilpatrick Townsend & Stockton LLP

(57) ABSTRACT

A transistor unit and an array and an integrated circuit thereof are provided. The transistor unit includes: a substrate; N gates located on the substrate, a projection of the N gates on a surface of the substrate forming a closed shape; a first source region located in the substrate and a projection of the first source region on the surface of the substrate being located in the closed shape, the first source region being shared by the N gates; N drain regions located in the substrate, each drain region and the source region being located respectively on two sides of the corresponding gate; first source end conductive plugs located on the first source region; drain end conductive plugs disposed on each drain region; a first source end metal layer located on the first source end conductive plugs; a drain end metal layer located on the drain end conductive plugs.

15 Claims, 3 Drawing Sheets

(58) Field of Classification Search
CPC ..... H10D 84/0177; H10D 64/662–664; H10D 89/60–931; H01L 23/60
See application file for complete search history.

(56) References Cited

U.S. PATENT DOCUMENTS

| | | | |
|---|---|---|---|
| 2007/0246740 A1 | 10/2007 | Yu | |
| 2008/0157195 A1 | 7/2008 | Sutardja et al. | |
| 2014/0103434 A1* | 4/2014 | Lu .......................... | H10D 30/60 |
| | | | 716/120 |
| 2015/0091095 A1 | 4/2015 | Lin et al. | |
| 2023/0013845 A1* | 1/2023 | Liaw ....................... | G11C 8/16 |
| 2023/0197571 A1* | 6/2023 | Sharma ................ | H10D 64/683 |
| | | | 257/296 |

FOREIGN PATENT DOCUMENTS

| | | | | | |
|---|---|---|---|---|---|
| CN | 101452936 A | | 6/2009 | | |
| CN | 101510559 A | | 8/2009 | | |
| CN | 101657901 A | | 2/2010 | | |
| CN | 102105986 A | | 6/2011 | | |
| CN | 102142462 A | | 8/2011 | | |
| CN | 201946601 U | | 8/2011 | | |
| CN | 103903938 A | * | 7/2014 | ............. | H05B 41/14 |
| CN | 104517962 A | | 4/2015 | | |
| CN | 106024589 A | * | 10/2016 | | |
| CN | 106328596 A | * | 1/2017 | ........... | H01L 23/585 |
| CN | 109904164 A | | 6/2019 | | |
| CN | 111599862 A | | 8/2020 | | |
| CN | 211350664 U | | 8/2020 | | |
| JP | H09129867 A | | 5/1997 | | |

\* cited by examiner

TRANSISTOR UNIT AND ARRAY AND INTEGRATED CIRCUIT THEREOF

CROSS-REFERENCE TO RELATED APPLICATIONS

This application is a continuation application of International Application No. PCT/CN2022/092382, filed on May 12, 2022, which claims priority to Chinese Patent Application No. 202111602790.7, filed on Dec. 24, 2021. The disclosures of these applications are hereby incorporated by reference in their entirety.

BACKGROUND

When the discharge current generated by electro static discharge (ESD) flows through the integrated circuit, a situation of local heating or electric field concentration will occur, which will damage the integrated circuit and lead to the failure of the integrated circuit. Therefore, in order to prevent the damage caused by ESD, an ESD protection element is generally provided between the input/output (I/O) interface of an integrated circuit and the internal core circuit. Herein, a metal oxide semiconductor field effect transistor (MOSFET) element is usually used for ESD protection in the integrated circuit, which can discharge the corresponding ESD discharge current to ground and avoid damaging the semiconductor devices in the integrated circuits involved and/or metal interconnects.

However, in the related art, the transistor elements used for ESD protection have the problems of limited discharge capacity and low integration.

SUMMARY

The present disclosure relates to the technical field of semiconductor, in particular to a transistor unit and an array and an integrated circuit thereof.

Embodiments of the disclosure propose a transistor unit and an array and an integrated circuit thereof.

The embodiments of the disclosure provide a transistor unit, and the transistor unit includes: a substrate; N gates, all located on the substrate, a projection of the N gates on a surface of the substrate forming a closed shape, N being a positive integer greater than 2; a first source region located in the substrate and a projection of the source region on the surface of the substrate being located in the closed shape; and the first source region being shared by the N gates; N drain regions located in the substrate, each of the N drain regions and the first source region located respectively on two sides of the corresponding gate of the N gates; a plurality of first source end conductive plugs located on the first source region and being in electrical contact with the first source region; a plurality of drain end conductive plugs disposed on and being in electrical contact with each of the drain regions; a first source end metal layer located on the first source end conductive plugs and being in electrical contact with all of the first source end conductive plugs; a drain end metal layer located on the drain end conductive plugs and being in electrical contact with all of the drain end conductive plugs.

Embodiments of the present disclosure further provide a transistor unit array, including a plurality of the transistor units provided by the embodiments of the disclosure; the plurality of transistor units are arranged in an array.

Embodiments of the disclosure further provide an integrated circuit, including the transistor unit array provided by the embodiments of the disclosure.

DETAILED DESCRIPTION

Figure 1:
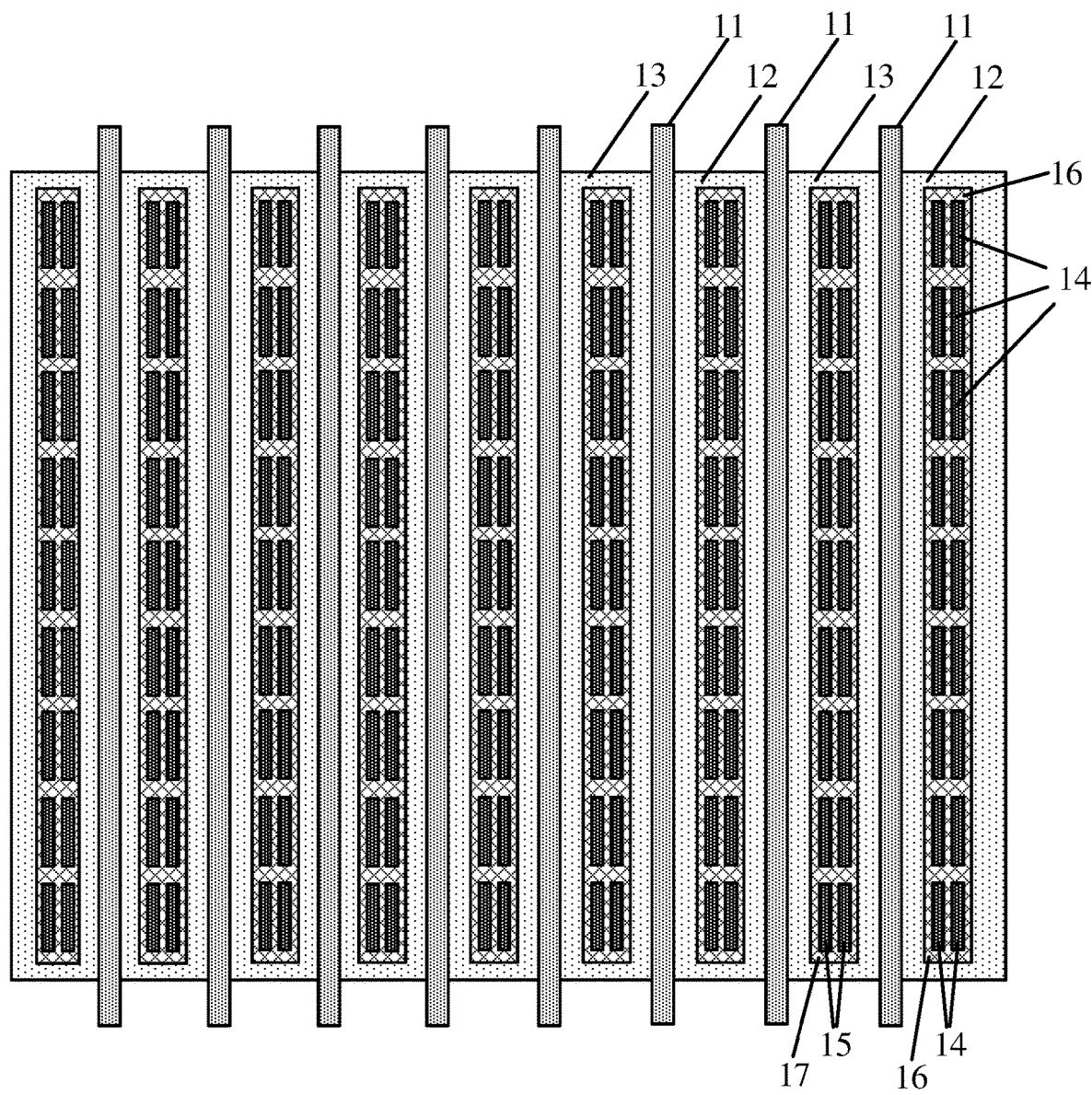
FIG. 1 is a partial schematic diagram of an ESD layout in the related art.

Exemplary embodiments of the present disclosure will be described in more detail below with reference to the accompanying drawings. Although exemplary embodiments of the present disclosure are shown in the drawings, it should be understood that the present disclosure may be implemented in various forms and should not be limited to the specific embodiments set forth herein. These embodiments are provided so that the disclosure will be more thoroughly understood and the scope of the disclosure will be fully conveyed to those skilled in the art.

In the description hereinafter, numerous specific details are given to provide a more thorough understanding of the disclosure. However it will be apparent to those skilled in the art that the disclosure may be implemented without one or more of these details. In other examples, some technical features well-known in the art are not described in order to avoid confusion with the present disclosure; that is, not all of the features of actual embodiments are described herein, and well-known functions and structures are not described in detail.

In the drawings, the dimensions of layers, regions, elements and their relative dimensions may be exaggerated for clarity. The same reference numeral denotes the same element throughout the text.

It should be understood that spatial relationship terms such as "beneath", "below", "lower", "under", "above", or "upper" may be used herein for convenience to describe a relationship between one element or feature and another element or feature shown in the drawings. It should be understood, the spatial relationship terms tend to further include different orientations of a device in use and operation in addition to the orientations shown in the drawings. For example, if the device in the drawings is turned over, an element or feature described as being "below" or "under" or "beneath" another element will be oriented as being "above" the other element or feature. Therefore, the exemplary terms "below" and "under" may include up and down orientations. The device may also include additional orientations (e.g., rotation for 90 degrees or other orientations), and the spatial terms used herein are interpreted accordingly.

The terms used herein are intended to describe specific embodiments only and are not to be a limitation to the present disclosure. As used herein, the singular forms "a/an", "one", and "the/said" are intended to include the plural forms as well, unless the context clearly dictates otherwise. It should be further understood that when terms "consist of" and/or "comprise/include" used in the specification mean that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

It should be noted that "first", "second", or the like are used to distinguish similar objects, and need not be used to describe a specific order or sequence.

In order to enable a more detailed understanding of the features and technical content of the embodiments of the present disclosure, the implementation of the embodiments of the present disclosure will be described in detail below in conjunction with the drawings, which are for illustration only and are not intended to limit the embodiments of the present disclosure.

Industrial investigation shows that about 40% of integrated circuit (IC) failures are related to ESD. In order to prevent the circuit from being damaged by electrostatic discharge, it is necessary to design ESD layout.

FIG. 1 illustrates a partial schematic diagram of an ESD layout in the related art. As shown in FIG. 1, a plurality of gates 11 which are parallel to each other, sources 12 and drains 13 respectively located on two sides of each gate 11, source end conductive plugs 14 located on the sources 12 and being in electrical contact with the sources 12, drain end conductive plugs 15 located on the drains 13 and being in electrical contact with the drains 13, source end metal layers 16 located on the source end conductive plugs 14 and being in electrical contact with the source end conductive plugs 14; and drain end metal layers 17 located on the drain end conductive plugs 15 and being in electrical contact with the drain end conductive plugs 15, are provided in the ESD layout. In practical application, the material of the gates 11 may be polysilicon; the positions of the source 12 and the drain 13 on two sides of gate may be exchanged.

As can be seen from FIG. 1, the ESD layout in related art is required to meet the ESD rules, and the distance between the source and the drain and the gate is very large, which will waste more area and lead to too large area occupied by the whole layout. At the same time, the number of the source end conductive plugs and drain end conductive plugs is small, so the ability of transistor elements in the ESD layout to discharge current is limited.

On the basis of this, in various embodiments of the present disclosure, the sources of a plurality of transistors are connected and the gates of the plurality of transistors are connected to form a standard cell in a closed shape. It could be understood that the sharing of the sources makes the transistor unit provided by the embodiments of the present disclosure occupy a small area; at the same time, the shared source regions can provide a larger area to arrange more source end conductive plugs, and the more source end conductive plugs make the transistor unit provided by the embodiments of the present disclosure have stronger ability to discharge current.

The embodiments of the disclosure provide a transistor unit, and the transistor unit includes: a substrate; N gates, all located on the substrate, a projection of the N gates on a surface of the substrate forming a closed shape, N being a positive integer greater than 2; a first source region in the substrate and a projection of the first source region on the surface of the substrate is located in the closed shape; the first source region being shared by the N gates; N drain regions in the substrate, each of the N drain regions and the first source region are respectively located on two sides of a corresponding gate of the N gates; a plurality of first source end conductive plugs located on the first source region and being in electrical contact with the first source region; a plurality of drain end conductive plugs being provided on each of the drain regions, and the plurality of drain end conductive plugs being in electrical contact with a corresponding drain region; a first source end metal layer, located on the first source end conductive plugs and being in electrical contact with all of the first source end conductive plugs; and a drain end metal layer, located on the drain end conductive plugs and being in electrical contact with all of the drain end conductive plugs.

It should be noted that the transistor unit provided by the embodiments of the disclosure may be an NMOS element or a PMOS element.

Herein, the substrate may be any base material well known to those skilled in the art for making transistors, such as silicon (Si), germanium (Ge), silicon germanium (SiGe), silicon on insulator (SOI) or germanium on insulator (GOI), or the like. In some embodiments, the material of the substrate includes silicon. The substrate may be provided with a shallow trench isolation structure for defining the active area, and the shape of the active area may be rectangular or other shapes.

Here, the bottom of the gates can be isolated from the substrate by a gate dielectric layer, the top surface of the gates can be covered with a gate isolation layer, and a sidewall can be formed on the side surface of the gate, and both the gate isolation layer and the sidewall are used for protecting the gate. The gate may be either a metal gate structure or a polysilicon gate structure. When the gate is the metal gate structure, it can be fabricated by an alternative gate process.

The number of the gates (or strips) is a positive integer greater than 2, and the closed shape may include various regular or irregular shapes. In some embodiments, the N is 3, 4, 5 or 6. Exemplarily, the number of the gates is 4, and the closed shape includes a square; exemplarily, the number of the gates is 5, and the closed shape includes a pentagon; exemplarily, the number of the gates is 6, and the closed shape includes a hexagon.

It should be noted that the projection of the plurality of gates on the surface of the substrate can form just a closed shape, or can form more shapes than a closed shape. In some specific examples, the number of the gates is 4, and the projection of the 4 gates on the surface of the substrate may form exactly a square; in other specific examples, the projection of the 4 gates on the surface of the substrate may also form a sudoku pattern, including a square in the middle of the sudoku pattern.

Here, in this embodiment, the transistor unit includes at least one first source region shared by the N gates and N drain regions, in which the first source region is located in the active area of the substrate and the projection on the surface of the substrate is located in the closed shape. The N drain regions are located in the active area of the substrate and each of the N drain regions and the first source region are respectively located on two sides of the corresponding gate of the N gates. It should be noted that the number of the drain regions here can be the same as the number of the gates.

The transistor unit may also include more source regions when the projection of the plurality of gates on the surface of the substrate forms more shapes than the closed shape.

On the basis of this, in some embodiments, the transistor unit further includes N second source regions, second source end conductive plugs, and N second source end metal layers; in which, the N second source regions are located in the substrate; a projection of each of the N second source regions on the surface of the substrate is located outside the closed shape, and each of the N second source regions is separated from each of the drain regions and on either side of a corresponding gate of the N gates.

Here, the N second source regions are located in the active area of the substrate.

In practical application, the drain regions and source regions of transistor elements with different conductivity types are doped with ions of corresponding conductivity types. For example, when the transistor element is an N-type transistor, the doped ions in the drain region, the first source region and the second source region are N-type doped ions, and the N-type doped ions are for example phosphorus (P) ions, arsenic (As) ions, antimony (Sb) ions, or the like; when the transistor element is a P-type transistor, the doped ions in the drain region, the first source region and the second source region are P-type doped ions, and the P-type doped ions are, for example, boron (B) ions, boron fluoride ($BF_2$) ions, crops (Ga) ions, indium (In) ions, or the like.

Here, a plurality of the second source end conductive plugs are provided on the each second source region, and a plurality of second source end conductive plugs are in electrically contact with the corresponding second source region. Herein, electrical contact can be understood as physical contact and electrical connection. In some embodiments, the plurality of first source end conductive plugs are arranged in an array. In some embodiments, each of the first source end conductive plugs has the same shape, such as a strip shape. In some embodiments, each of the first source end conductive plugs is of the same material, including, for example, titanium (Ti), tungsten (W), cobalt (Co), nickel (Ni), zirconium (Zr), molybdenum (Mo), tantalum (Ta), copper (Cu), aluminum (Al), and the like.

In some embodiments, when N second source regions are present, a plurality of the second source end conductive plugs are correspondingly present on each of the second source regions, and the plurality of second source end conductive plugs are located on the second source region and are in electrical contact with the second source region. In practical application, the material of each of the second source end conductive plugs is the same as the material of the first source end conductive plugs.

In some embodiments, the plurality of drain end conductive plugs are arranged in an array. In some embodiments, each of the drain end conductive plugs has the same shape, such as a strip shape. In some embodiments, each of the drain end conductive plugs is of the same material, including, for example, titanium (Ti), tungsten (W), cobalt (Co), nickel (Ni), zirconium (Zr), molybdenum (Mo), tantalum (Ta), copper (Cu), aluminum (Al), and the like. It should be note that, the shape and the material of the first source end conductive plugs is the same as those of the drain end conductive plugs.

It should be note that, the first source end conductive plugs, the second source end conductive plugs and the drain end conductive plugs are all conductive contact structures, which can be expressed as Licon in English.

It could be understood that the design of a plurality of first source end conductive plugs, a plurality of second source end conductive plugs and a plurality of drain end conductive plugs, compared with the design of one source end conductive plug and one drain end conductive plug, can establish a wider and more uniform current release path, so that the current distribution and discharge uniformity during ESD discharge can be improved, thereby improving ESD protection ability.

Here, the first source end metal layer is formed on the first source end conductive plugs and is in electrical contact with all of the first source end conductive plugs; In practical application, the shape of the first source end metal layer can be adapted to the closed shape formed by the gates above-mentioned. For example, the closed shape is a square, and the shape of the first source end metal layer is a square with an area slightly smaller than the area of the square in which the closed shape is a square.

In practical application, the material of the first source end metal layer can be the same as that of the first source end conductive plugs, that is, the material of the first source end conductive plugs may also include titanium (Ti), tungsten (W), cobalt (Co), nickel (Ni), zirconium (Zr), molybdenum (Mo), tantalum (Ta), copper (Cu), aluminum (Al), and the like.

In some embodiments, when N second source regions are present, N second source end metal layers correspondingly also exist. Each of the N second source end metal layers is respectively located on a corresponding second source region of the N second source regions and is in electrical contact with all of the second source end conductive plugs on the corresponding second source region. In practical application, the shape of the second source end metal layer can be adapted to the closed shape formed by the gates above-mentioned. For example, the closed shape is square, and the shape of the second source end metal layer is also square. In practical application, the material of each second source end metal layer is the same as the material of the first source end conductive plugs.

Here, the drain end metal layer is formed on the drain end conductive plugs and is in electrical contact with all of the drain end conductive plugs. In practical application, the shape of the drain end metal layer can be adapted to the closed shape formed by the gates above-mentioned. For example, the closed shape is a square, and the shape of the drain end metal layer is a rectangular-ambulatory-plane shape with an area slightly larger than the area of the square in which the closed shape is square, that is, the orthographic projection of the drain end metal layer on the plane of the substrate surrounds the orthographic projection of the first source end metal layer on the plane of the substrate. It should be noted that the shape of the drain end metal layer can also be independently set corresponding to N drain regions. It could be understood that when the N drain regions share the same drain end metal layer, it is more conducive to the miniaturization of area of the transistor unit provided by the embodiments of the present disclosure; at the same time, sharing the same drain end metal layer can provide a larger area to provide more drain end conductive plugs, and the more drain end conductive plugs make the transistor unit provided by the embodiments of the present disclosure to have stronger ability to discharge current.

In practical application, the material of the drain end metal layer can be the same as that of the drain end conductive plugs, that is, the material of the first source end conductive plugs may also include titanium (Ti), tungsten (W), cobalt (Co), nickel (Ni), zirconium (Zr), molybdenum (Mo), tantalum (Ta), copper (Cu), aluminum (Al), and the like.

In some embodiments, the orthographic projection of the first source region on the plane where the substrate is located covers the orthographic projection of the first source end metal layer on the plane where the substrate is located; and the orthographic projection of the drain end metal layer on the plane where the substrate is located surrounds the orthographic projection of the first source end metal layer on the plane where the substrate is located.

Here, the orthographic projection can be understood as a projection formed on the projection plane when vertical lines are drawn from the outer contour of the object to be projected to the projection plane. In the embodiments of the disclosure, since the N gates share the first source region, when the orthographic projection of the drain end metal layer on the plane where the substrate is located surrounds the orthographic projection of the first source end metal layer on the plane wherein the substrate is located, the sharing can be better realized.

In some embodiments, the geometric centerlines of the first source end metal layer and the drain end metal layer coincide.

It can be understood that when the geometric centerlines of the first source end metal layer and the drain end metal layer coincide, the source end and the drain end arrangement with good symmetry can be obtained, thereby ensuring that the channel of the electrostatic discharge is uniform and the size mutation is not generated, that is, the discharge current of the transistor unit is more stable.

In some embodiments, when the transistor unit provided by this embodiment is an NMOS element and is protected by static electricity, the drain regions are connected to an I/O interface or a power port through the drain end conductive plugs and the drain end metal layer, and the first source region is grounded through the first source end conductive plugs and the first source end metal layer, and the second source regions are grounded through the second source end conductive plugs and the second source end metal layer, gates is grounded. The drain regions are used as the input end of the ESD discharge current, and the first source region is used as the discharge end of the ESD discharge current. Under the ESD discharge current, the NMOS element is turned on, the channel of the NMOS is opened first, and the ESD discharge current enters from the drain end metal layer, and is discharged sequentially through all the drain end conductive plugs, the drain regions, the channel/substrate, the source regions, all the first source end conductive plugs and the first source end metal layer. At the same time, the second source end conductive plugs and the drain end conductive plugs correspondingly establish a current release path to discharge the ESD current.

In some other embodiments, when the transistor unit provided by this embodiment is a PMOS element and is protected by static electricity, the drain regions are grounded through the drain end conductive plugs and the drain end metal layer. The first source region is connected to an I/O interface or a power port through the first source end conductive plugs and the first source end metal layer, and the gates are connected to the power port. The first source region is used as the input end of the ESD discharge current, the drain regions are used as the discharge end of the ESD discharge current. Under the ESD discharge current, the PMOS element is turned on, the channel of the PMOS is turned on first, and the ESD discharge current enters from the first source end metal layer, and is discharged sequentially through all the first source end conductive plugs, the first source region, the channel/substrate, the drain regions, the drain end conductive plugs, all the drain end conductive plugs and the drain end metal layer. At the same time, the second source end conductive plugs and the drain end conductive plugs correspondingly establish a current release path to discharge the ESD current.

The embodiments of the disclosure provide a transistor unit, which includes: a substrate; N gates, all located on the substrate, a projection of the N gates on a surface of the substrate forming a closed shape, N being a positive integer greater than 2; a first source region located in the substrate and whose projection on the surface of the substrate is located in the closed shape, the first source region being shared by the N gates; N drain regions in the substrate, each of the N drain regions and the first source region are located respectively on two sides of the corresponding gate of the N gates; a plurality of first source end conductive plugs located on the first source region and being in electrical contact with the first source region; a plurality of drain end conductive plugs provided on each of the drain regions, and the plurality of drain end conductive plugs being in electrically contact with the corresponding drain region; a first source end metal layer, located on the first source end conductive plugs and are in electrical contact with all of the first source end conductive plugs; a drain end metal layer, located on the drain end conductive plugs and are in electrical contact with all of the drain end conductive plugs. In the embodiments of the present disclosure, the sources of a plurality of transistors are connected together and the gates of the plurality of transistors are connected to form a standard cell in a closed shape. It could be understood that the sharing of the sources makes the transistor unit provided by the embodiments of the present disclosure occupy a small area; at the same time, the common source regions can provide a larger area to provide more source end conductive plugs, and the more source end conductive plugs make the transistor unit provided by the embodiments of the present disclosure have stronger ability to discharge current.

Figure 2:
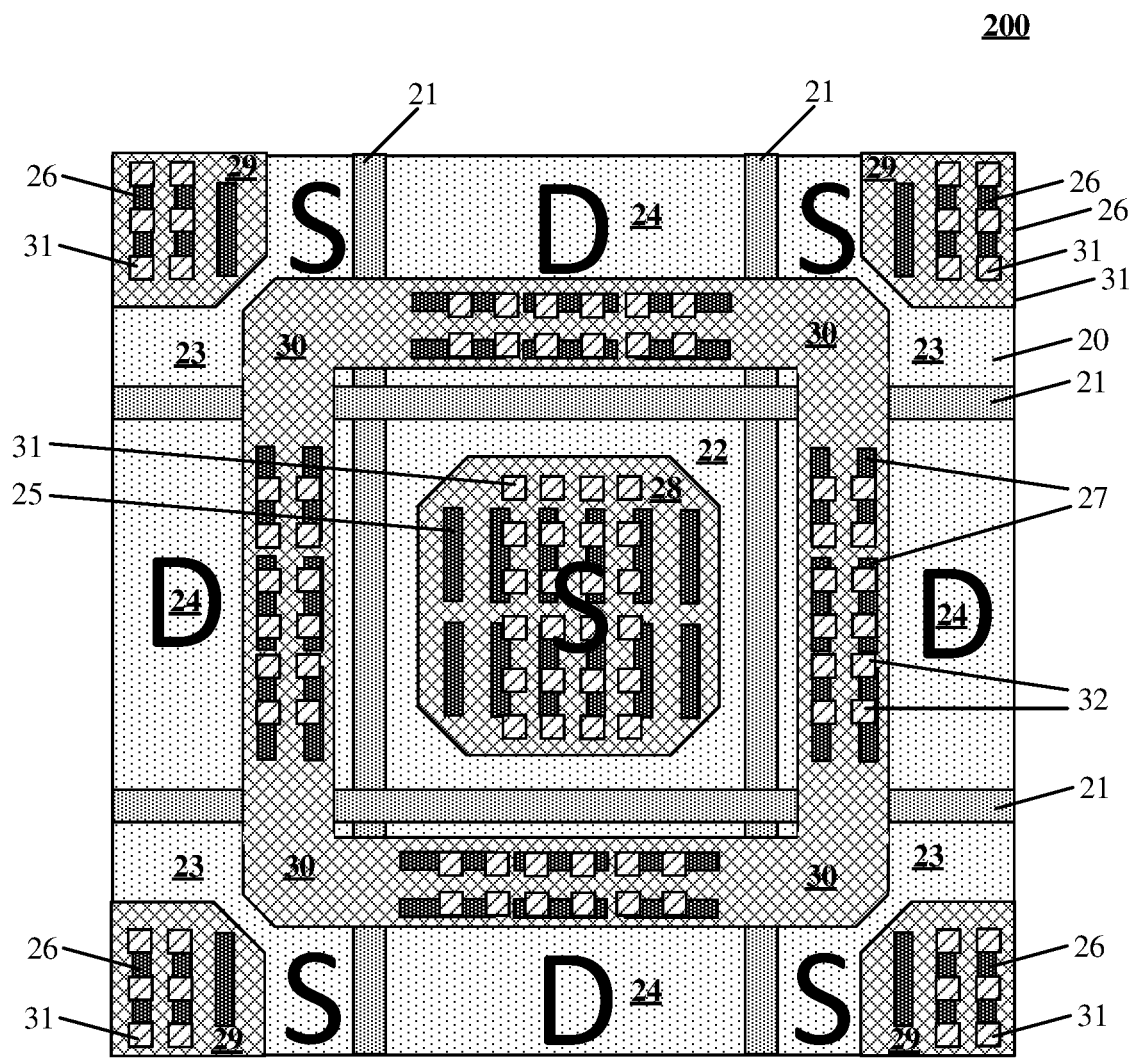
FIG. 2 is a schematic structural diagram of a transistor unit provided by an embodiment of the disclosure.

In an application scenario, the N=4. That is, four gates are included. FIG. 2 is a schematic structural diagram of a transistor unit with 4 gates provided by an embodiment of the disclosure. As shown in FIG. 2, the transistor unit 200 includes: a substrate; 4 N gates 21, all located on the substrate, the projection of the 4 gates 21 on the surface of the substrate forming a square; a first source region 22 located in the active area 20 of the substrate and a projection of the first source region 22 on the surface of the substrate is located in the square; the first source region 22 being shared by the 4 gates 21; 4 second source regions 23 located in the active area 20 of the substrate; the projection of each of the 4 second source regions 23 on the surface of the substrate being located outside the square, and each of the 4 second source regions one of the 4 drain regions 24 being located respectively on two sides of the corresponding gate; 4 drain regions 24 located in the active area 20 of the substrate, each of the 4 drain regions 24 and the first source region 22 being located respectively on two sides of the corresponding gate of the 4 gates 21; a plurality of first source end conductive plugs 25 located on the first source region 22 and being in electrical contact with the first source region 22; a plurality of second source end conductive plugs 26 provided on the each second source region 23 and being in electrically contact with the corresponding second source region 23; a plurality of drain end conductive plugs 27 provided on the each drain region 24, and being in electrically contact with the corresponding drain region 24; a first source end metal layer 28, located on the first source end conductive plugs 25 and being in electrical contact with all of the first source end conductive plugs 25; 4 second source end metal layers 29, each of the 4 second source end metal layers being respectively located on the corresponding second source region of the 4 second source regions 23 and being in electrical contact with all of the second source end conductive plugs 26 on the corresponding second source region 23; and a drain end metal layer 30, located on the drain end conductive plugs 27 and being in electrical contact with all of the drain end conductive plugs 27.

Here, the middle and four corners of the transistor unit 200 are sources, and the four sides are drains.

In practical application, the 4 gates 21 can form an arbitrary closed quadrilateral, such as a rectangle, a diamond, or the like. It can be understood that when the 4 gates 21 form a square, the transistor unit can have a more reasonable symmetrical arrangement of the source and drain ends and a simpler manufacturing process.

On the basis of this, in some embodiments, the projection of the N gates 21 on the surface of the substrate forms a first square.

As mentioned above, the first source end metal layer 28, the second source end metal layer 29, and the drain end metal layer 30 are all adapted to the closed shape formed by the gates 21. In some embodiments, the projection of the first source end metal layer 28 on the surface of the substrate forms a second square, and the second square is located in the first square; the projection of the second source end metal layer 29 on the surface of the substrate forms a third square, and the third square is located outside the first square; the projection of the drain metal layer 30 on the surface of the substrate forms a rectangular-ambulatory-plane shape in which the first square is located.

In some embodiments, the geometric centerlines of the first square, the second square and the rectangular-ambulatory-plane shape coincide.

It can be understood that by designing the shapes of the first source end metal layer 28, the second source end metal layers 29, and the drain end metal layer 30 in the above manner, a source and drain end arrangement with good symmetry can be obtained, thereby ensuring that the channel of the electrostatic discharge is uniform and does not occur no sudden change in size, that is, the discharge current of the transistor unit is more stable.

In some embodiments, the total area of the N second source regions is equal to an area of the first source region.

Figure 3:
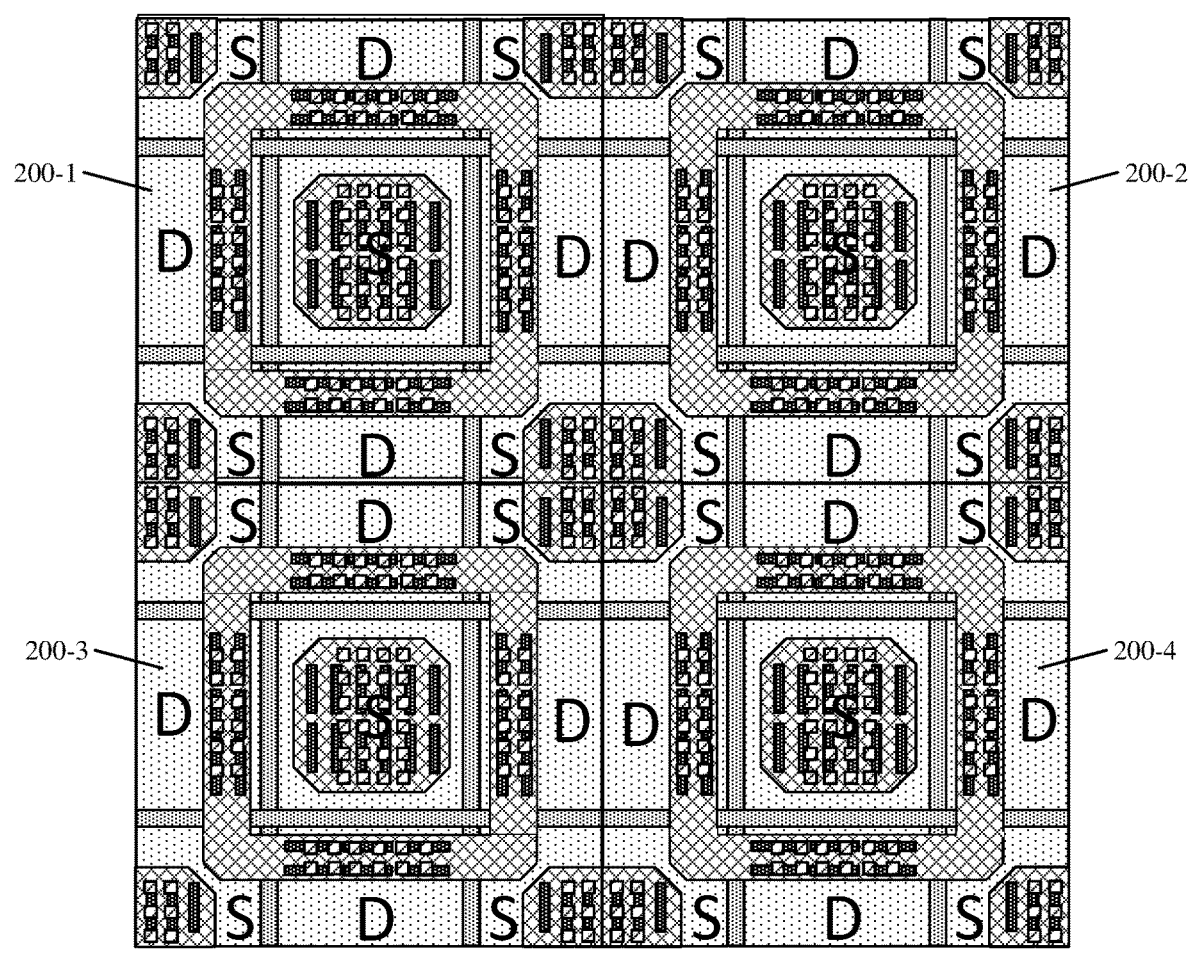
FIG. 3 is a schematic structural diagram of a transistor unit array provided by an embodiment of the disclosure.

For example, the total area of the 4 second source regions 23 in FIG. 2 is equal to the area of the first source region 22. It can be understood that when the total area of the N second source regions is equal to the area of the first source region, it is more convenient to splicing a plurality of transistor units. For example, when the 4 transistor units in FIG. 3 are spliced, the area of the spliced 4 second source regions in the middle of the corresponding 4 first source regions of the 4 transistor units is equal to the area of each first source region of the 4 first source regions. In this way, the channel of the electrostatic discharge of the structure obtained by splicing a plurality of transistor units can be ensured to be uniform, so that the discharge current of the transistor units is more stable.

In practical application, considering that the right angle is sharp and is prone to generating electric discharge phenomenon, the angles of the second square and the rectangular-ambulatory-plane can be rounded or chamfered to prevent the generation of electric discharge phenomenon.

On the basis of this, in some embodiments, the angles of the second square and the rectangular-ambulatory-plane are both rounded or chamfered.

FIG. 2 illustrates a case where the angles of the second square and the rectangular-ambulatory-plane are chamfered.

In some embodiments, the first source end conductive plugs 25 are aligned and spaced apart from each other along a direction parallel to any one of the N gates 21 to form M first source end conductive plug rows parallel to any one of the gates; for each second source region 23 of the N second source regions, the plurality of second source end conductive plugs 26 on each second source region 23 are aligned and spaced apart from each other along a direction parallel to a corresponding gate to form K second source end conductive plug rows parallel to the corresponding gate; for each drain region 24 of the N drain regions, the plurality of drain end conductive plugs 27 on each drain region 24 are aligned and spaced apart from each other along a direction parallel to a corresponding gate to form P drain end conductive plug rows parallel to the corresponding gate; in which M, K and P are all positive integers.

In practical application, the first source end conductive plugs 25, the second source end conductive plugs 26 and the drain end conductive plugs 27 may have the same shape and material.

In practical application, the values of M, K and P may be adjusted according to the actual situation, and the situation of M=2, K=1 and P=2 is shown in FIG. 2.

In some embodiments, the total number of the first source end conductive plugs 25 on the first source region 22 is the same as the total number of the second source end conductive plugs 26 on the N second source regions 23.

As shown in FIG. 2, the total number of the first source end conductive plugs 25 on the first source region 22 is the same as the total number of the second source end conductive plugs 26 on the N second source regions 23, and both are 24.

In some other embodiments, the total number of the first source end conductive plugs 25 and the second source end conductive plugs 26 is the same as the total number of the drain end conductive plugs 27.

In some embodiments, the first source end conductive plugs 25, the second source end conductive plugs 26 and the drain end conductive plugs 27 have the same shape and size.

the projections of the first source terminal conductive plug 25, the second source terminal conductive plug 26 and the drain terminal conductive plug 27 on the substrate surface are all elongated. FIG. 2 illustrates the case that the projections of the first source end conductive plugs 25, the second source end conductive plugs 26 and the drain end conductive plugs 27 on the surface of the substrate are strip.

In some embodiments, the transistor unit further includes a plurality of source end contacts 31 respectively located on the first source end metal layer 28 and the second source end metal layers 29 and respectively being in electrical contact with the first source end metal layer 28 or the second source end metal layers 29; the transistor unit also includes drain contacts 32 located on the drain end metal layer 30 and being in electrical contact with the drain end metal layer 30.

In practical application, the source end contacts 31 are used to electrically lead out the corresponding first source end metal layer 28 and the second source end metal layers 29 respectively, to connect with a power supply interface or ground according to actual requirements. The drain contacts 32 are used to electrically lead out the drain metal layer 30 for connecting with ground or a power supply interface as required.

It should be noted that, the source contact 31 and the drain contact 32 are both conductive contact structures, which can be expressed as Contact in English.

In some embodiments, projections of the source end contacts 31 and the drain end contacts 32 on the surface of the substrate are distributed in a dot shape.

FIG. 2 illustrates the case that projections of the source end contacts 31 and the drain contacts 32 on the surface of the substrate are distributed in a dot shape.

Based on the aforementioned transistor unit, embodiments of the present disclosure further provide a transistor unit array, which includes a plurality of transistor units provided by the embodiments of the disclosure, and the plurality of transistor units are arranged in an array.

In some embodiments, the drain regions of two adjacent ones of the transistor units are electrically connected; the second source regions of two adjacent ones of the transistor units are electrically connected.

The transistor unit array provided by present disclosure includes one or more transistor units according to the disclosure, in which the transistor element is NMOS element or PMOS element. When the transistor unit array has a plurality of the transistor elements with the same type, the plurality of the transistor elements are connected in parallel and arranged in a manner of sharing source-drain. As shown in FIG. 3, the transistor unit array 300 in an embodiment of the present disclosure is mainly composed of four parallel transistor units of the present disclosure (such as the four transistor units 200-1, 200-2, 200-3 and 200-4 in FIG. 3), in which the four transistor elements are formed in the same active area, and the adjacent transistor elements are common-source or common-drain.

The transistor unit array of the above embodiments has four transistor units of the present disclosure; however, the technical solution of the present disclosure is not limited to this. The number of transistor elements of the present disclosure in transistor unit arrays of other embodiments of the disclosure may be multiple, such as two, three or four, or more than four. In addition, when the number of transistor elements of the present disclosure is greater than or equal to two, the parallel connection of two adjacent transistor elements can be realized by using the parallel connection mode of common source and common drain of two adjacent transistor elements shown in FIG. 3. Further, the configuration of each transistor element of the disclosure in the transistor unit array of the embodiments of the disclosure may be identical or may be partially identical. For example, in other embodiments of the present disclosure, the transistor unit array includes at least one PMOS element of the present disclosure and at least one NMOS element of the present disclosure.

As described above, the transistor unit array of the present disclosure has simple structure and better protection performance. The transistor unit array of the present disclosure can be used as an independent device to be installed on a corresponding device circuit or integrated into a corresponding integrated circuit.

It could be understood that by splicing transistor units together to form a transistor unit array, the source and drain are shared at the same time, which will greatly reduce the wasted area caused by the sources and drains being too far away from the gates, thus reducing the area of the whole ESD array layout.

Because the active area of the substrate is fully utilized, the total width of the transistor unit array is the number of transverse gates multiplied by the length of transverse gates plus the number of longitudinal gates multiplied by the length of longitudinal gates. Compared with the ESD layout provided in the related art, the ESD array layout provided by the embodiment of the present disclosure has smaller area under the condition of the same total width, at the same time, the number of Licon increases, and the current discharge ability is stronger. In addition, the overall shape of the ESD array layout provided by the embodiments of the present disclosure can be adjusted by splicing.

On the basis of the transistor unit array above-mentioned, embodiments of the disclosure further provide an integrated circuit, which includes the transistor unit array provided by the embodiments of the disclosure.

In practical application, the integrated circuit includes the transistor unit array of the present disclosure, as well as an input/output interface and an internal circuit, in which the transistor unit array is connected between the input/output interface and the internal circuit. Specifically, the transistor unit array includes an NMOS cell and/or a PMOS cell, in which the drain region of the NMOS elements is connected between the input/output interface and an internal circuit and the source region and the gate of the NMOS element are grounded; or the source region of the PMOS element is connected between the input/output interface and the internal circuit, the gate of the PMOS element is connected to the power supply port, and the drain region of the PMOS element is grounded.

It should be understood that references to "one embodiment" or "an embodiment" throughout the specification mean that specific features, structures, or characteristics related to the embodiments are included in at least one embodiment of the present disclosure. Thus, the terms "in one embodiment" or "in an embodiment" appearing throughout the specification do not necessarily refer to the same embodiment. Further these specific features, structures or characteristics may be incorporated in any suitable manner in one or more embodiments. It should be understood that, in various embodiments of the present disclosure, the size of the sequence number of the above-described processes does not mean the sequence of execution, and the execution order of each process should be determined by its function and inherent logic, and should not limit the implementation of the embodiments of the present disclosure. The above serial numbers of the embodiments of the present disclosure are for description only and do not represent the advantages and disadvantages of the embodiments.

The method disclosed in the embodiments of several methods provided in the disclosure can be arbitrarily combined without conflict to obtain a new embodiment of a method.

The descriptions above are only some specific embodiments of the present disclosure, and are not intended to limit the scope of protection of the embodiments of the present disclosure. Any change and replacement that can be easily thought of by those skilled in the art within the technical scope of the embodiments of the present should fall with the protection scope of the present disclosure. Therefore, the scope of protection of the embodiments of the present disclosure shall be subject to the scope of protection of the claims.

INDUSTRIAL PRACTICALITY

In the embodiments of the present disclosure, the sources of a plurality of transistors are connected together and the gates of the plurality of transistors are connected to form a standard cell in a closed shape. It could be understood that the sharing of the sources makes the transistor unit provided by the embodiments of the present disclosure occupy a small area; at the same time, the shared source regions can provide a larger area to provide more source end conductive plugs, and the more source end conductive plugs make the transistor unit provided by the embodiments of the present disclosure have stronger ability to discharge current.

The invention claimed is:

1. A transistor unit, comprising:
a substrate;
N gates located on the substrate, a projection of the N gates on a surface of the substrate forming a closed shape, N being 5 or 6;
a first source region located in the substrate, a projection of the source region on the surface of the substrate being located in the closed shape, and the first source region being shared by the N gates;

N drain regions located in the substrate, each of the N drain regions and the first source region being located respectively on two sides of the corresponding gate of the N gates;

a plurality of first source end conductive plugs located on the first source region and being in electrical contact with the first source region;

a plurality of drain end conductive plugs disposed on and being in electrical contact with each of the drain regions;

a first source end metal layer located on the first source end conductive plugs and being in electrical contact with all of the first source end conductive plugs; and a drain end metal layer located on the drain end conductive plugs and being in electrical contact with all of the drain end conductive plugs;

wherein the closed shape formed by the projection of the N gates on the surface of the substrate is pentagon when N is 5, while the closed shape formed by the projection of the N gates on the surface of the substrate is hexagon when N is 6.

2. The transistor unit of claim 1, wherein the transistor unit further comprises: N second source regions, second source end conductive plugs, and N second source end metal layers, wherein, the N second source regions are located in the substrate; a projection of each of the N second source regions on the surface of the substrate is located outside the closed shape, and each of the N second source regions and one of the drain regions are located respectively on two sides the corresponding gate;

a plurality of the second source end conductive plugs are disposed on and in electrical contact with each of the second source regions; and each of the N second source end metal layers is respectively located on the corresponding second source region of the N second source regions and is in electrical contact with all of the second source end conductive plugs on the corresponding second source region.

3. The transistor unit of claim 2, wherein a total area of the N second source regions is equal to an area of the first source region.

4. The transistor unit of claim 2, wherein, the plurality of first source end conductive plugs are aligned and spaced apart from each other along an extending direction parallel to any one of the N gates to form M first source end conductive plug rows parallel to any one of the gates;

the plurality of second source end conductive plugs in each of the second source regions are aligned and spaced apart from each other along a direction parallel to the corresponding gate to form K second source end conductive plug rows parallel to the corresponding gate; and the plurality of drain end conductive plugs in each of the drain regions are aligned and spaced apart from each other along a direction parallel to the corresponding gate to form P drain end conductive plug rows parallel to the corresponding gate, wherein M, K and P are all positive integers.

5. The transistor unit of claim 2, wherein a total number of the first source end conductive plugs on the first source region is same as a total number of the second source end conductive plugs on the N second source regions.

6. The transistor unit of claim 2, wherein the first source end conductive plugs, the second source end conductive plugs and the drain end conductive plugs have a same shape and size.

7. The transistor unit of claim 6, wherein projections of the first source end conductive plugs, the second source end conductive plugs and the drain end conductive plugs on the surface of the substrate have a strip shape.

8. The transistor unit of claim 2, wherein, the transistor unit further comprises a plurality of source end contacts respectively located on the first source end metal layer and the second source end metal layers and in electrical contact with the first source end metal layer or the second source end metal layers; and the transistor unit further comprises drain contacts located on the drain end metal layer and in electrical contact with the drain end metal layer.

9. The transistor unit of claim 8, wherein projections of the source contacts and the drain contacts on the surface of the substrate are distributed in a dot shape.

10. The transistor unit of claim 1, wherein an orthographic projection of the first source region on a plane where the substrate is located covers an orthographic projection of the first source end metal layer on the plane where the substrate is located; and an orthographic projection of the drain end metal layer on the plane where the substrate is located surrounds the orthographic projection of the first source end metal layer on the plane where the substrate is located.

11. The transistor unit of claim 1, wherein geometric centerlines of the first source end metal layer and the drain end metal layer coincide.

12. A transistor unit array, comprising a plurality of the transistor units of claim 1; the plurality of the transistor units being arranged in an array.

13. The transistor unit array of claim 12, wherein the drain regions of two adjacent ones of the transistor units are electrically connected; and the second source regions of two adjacent ones of the transistor units are electrically connected.

14. An integrated circuit comprising the transistor unit array of claim 12.

15. An integrated circuit comprising the transistor unit array of claim 13.

* * * * *